United States Patent [19]

Enoki et al.

[11] 4,029,604

[45] June 14, 1977

[54] METHOD FOR PREPARING A PHOTOCONDUCTIVE POWDER

[75] Inventors: Yoshio Enoki, Katano; Nobumasa Ohshima, Hirakata, both of Japan

[73] Assignee: Matsushita Electric Industrial Co., Ltd., Japan

[22] Filed: Aug. 27, 1975

[21] Appl. No.: 608,405

[30] Foreign Application Priority Data

| | | |
|---|---|---|
| Sept. 4, 1974 | Japan | 49-102322 |
| Sept. 5, 1974 | Japan | 49-102719 |

[52] U.S. Cl. .................................. 252/501; 96/1.8

[51] Int. Cl.[2] .......................................... H01L 31/00

[58] Field of Search ........................ 252/501; 96/1.8

[56] References Cited

UNITED STATES PATENTS

| | | | |
|---|---|---|---|
| 3,647,430 | 3/1972 | Hanada et al. | 252/501 X |
| 3,658,523 | 4/1972 | Noe | 252/501 X |
| 3,703,594 | 11/1972 | Shigeaki et al. | 252/501 |
| 3,930,854 | 1/1976 | Jones et al. | 252/501 X |

*Primary Examiner*—Edward A. Miller
*Assistant Examiner*—E. Suzanne Parr
*Attorney, Agent, or Firm*—Wenderoth, Lind & Ponack

[57] ABSTRACT

This invention provides a method for preparing a photoconductive powder comprising firing a combined starting mixture of CdSe, ZnS, ZnO, a Cu or Ag salt, and a Cd or Zn chloride or bromide as a flux, and preferably a Mn salt also, at a temperature higher than the melting point of the flux, cooling the fired product, and re-firing the cooled product in a sulfur vapor containing atmosphere. The photoconductive powder obtained by this method has high photosensitivity, high threshold voltage and fine particle size.

12 Claims, No Drawings

METHOD FOR PREPARING A PHOTOCONDUCTIVE POWDER

This invention relates to a method for preparing a photoconductive powder, particularly to such powder suitable for a solid-state image converting panel.

A solid-state image converting panel, in its simplest form, comprises a photoconductive layer, an electroluminescent layer and a pair of transparent electrodes attached thereto. One example of a solid-state image converting panel is disclosed in U.S. Pat. No. 3,715,589, which panel converts an X-ray image into a visible image. The major characteristics of an image converting panel, e.g. brightness, contrast, picture quality and resolution, are very much affected by the materials and conditions of preparation for each layer, especially of the photoconductive layer. Similarly, the characteristics of a photoconductive layer are very much affected by the materials and conditions of preparation, especially photoconductive materials.

There are several types of photoconductive layers in prior art which have been used for solid-state image converting panels e.g. sintered, vacuum-evaporated, binder-bonded powders. The binder-bonded powders are suitable for making a uniform photoconductive layer with a large area. A photoconductive CdS powder has been very successfully used as a high-sensitive photoconductive layer due to its high threshold voltage. However, it has a disadvantage in that it is relatively slowly responsive to indicent photo-rays. On the other hand, a photoconductive CdSe powder, having been used for its quick response to incident photo-rays, has a relatively low threshold voltage (about 400 V) in comparison with CdS. The term "threshold voltage" and the desirability of high threshold voltage are explained below.

One method to increase photosensitivity of a solid-state image converting panel is to increase the voltage applied to the photoconductive layer of the image converting panel. The photoconductive layer is composed of a photoconductive powder such as CdSe and a binder material. When the voltage applied to the photoconductive layer is relatively low, the dark current therein increases linearly in proportion to the applied voltage, but when the applied voltage exceeds a certain voltage, the dark current starts to increase (namely, dark resistance decreases) superlinearly abruptly as the applied voltage increases. This certain voltage is inherent in any photoconductive layer or powder and is called the "threshold voltage" (Vt). In a solid-state image converting panel comprising a photoconductive layer and an electroluminescent layer, the voltage applied to the electroluminescent layer increases as the current in the photoconductive layer increases. Therefore, when the voltage applied to the photoconductive layer exceeds Vt, then the electroluminescent layer emits radiation even at the parts where no input photoray image exists. This phenomenon not only decreases contrast of the output image, but often causes breakdown of the solid-state image converting panel. Accordingly, there is a limit, due to the threshold voltage Vt, in improving the photosensitivity of a solid-state image converting panel by increasing the voltage applied to the photoconductive layer.

Another method of increasing the photosensitivity of a solid-state image converting panel is to use a more photosenitive photoconductive powder as a principal constituent for the photoconductive layer. But in general, the higher the photosensitivity of a photoconductive layer is, the lower the threshold voltage Vt is. Thus, it is very difficult with prior art techniques, to prepare a photoconductive layer simultaneously having high photosensitivity and a high threshold voltage Vt.

Another problem concerns photosensitivity and the particle size of a photoconductive powder. A fine photoconductive powder gives a superior resolution of the resultant image on a solid-state image converting panel, but in general, the finer the particle size of a photoconductive powder is, the lower the photosensitivity of the photoconductive powder or the photoconductive layer is. Accordingly, the prior art has not been able to prepare a photoconductive powder characterized by high photosensitivity, high threshold voltage Vt, and fine particle size.

An object of this invention is to provide a method for preparing a photoconductive powder which rapidly responds to incident photo-rays and has high photosensitivity, high threshold voltage and superior particle fineness.

Another object of this invention is to provide a method for preparing a photoconductive powder which is particularly useful in a photoconductive layer of a solid-state image converting panel.

These objects are achieved by the method of this invention which comprises: providing a starting mixture comprising (*i*) a host material consisting essentially of 65 to 95% by weight of CdSe powder, 3 to 15% by weight of ZnS powder, and 2 to 20% by weight of ZnO powder, (*ii*) as an activator a water soluble salt, of a member selected from the group consisting of Cu and Ag and (*iii*), as a flux, a member selected from the group consisting of $CdCl_2$, $CdBr_2$, $ZnCl_2$ and $ZnBr_2$; first firing the starting mixture at a temperature higher than the melting point of the flux to fuse the flux and dissolve the host material in the flux; cooling the thus fired mixture to at least partially recrystallize the host material to a solid solution, the thus treated material having the activator diffused therein; and re-firing the thus treated material in a sulfur vapor containing atmosphere increase the threshold voltage of the material.

One of the main features of this invention is in the use of a composition of host material powder comprising CdSe, ZnS and ZnO, and another feature is to incorporate a Mn salt, as an additive, in the starting mixture. The activating process is not limited to that described above (two-step firing process). A multi-step firing process such as a three-step firing process, explaind below and in Example 3, can also be used. According to this invention, the co-existence of CdSe, ZnS and ZnO in the starting mixture markedly improves photosensitivity, threshold voltage and fineness of resultant photoconductive powder. ZnS has the function of increasing the threshold voltage, and the combination of ZnS and ZnO acts to suppress particle size growth thus causing the resultant powder to be very fine and promotes particle contact to increase photosenstivity. Preferred amounts of CdSe, ZnS and ZnO in the host material are 65 to 95% by weight of CdSe, 3 to 15% by weight of ZnS and 2 to 20% by weight of ZnO. Other materials can be included in the host materials if these other materials do not impair the function of the combination of CdSe, ZnS and ZnO to cause high photosensitivity, high threshold voltage and fineness of the resultant powder. CdSe, ZnS and ZnO powders usually available are fine powders. Thus, such conventional powders can be used. To obtain resultant powders of fine particle size, it is not desirable to use special particles having large particle size. Preferred particle sizes (average) of CdSe, ZnS and ZnO are less than 5 microns, less than 1 micron, and less than 1 micron, respectively, to obtain a resultant particle size (average) of less than 10 microns.

Mn, as a salt, may be added to the starting mixture, and together with ZnS, raises the threshold voltage further. The Mn salts are preferably water soluble in order to be uniformly mixed with the host material. The preferred Mn salts are $MnCl_2$, $Mn(NO_3)_2$ and $MnSO_4$. The preferred amount of the Mn salt is in the range from 0.005 to 0.5 part by weight on the basis of 100 parts by weight of the host material. If the amount of the Mn salt is too large, the resultant photoconductive material has a smaller photosensitivity, and if the amount is too small, then the effect of Mn salt addition does not appear.

In the host material comprising CdSe, ZnS and ZnO, $CdS_xSe_{-x}$ $(0 < x < 1)$can be substituted for CdSe. Similarly, ZnSe can be substituted for ZnS. Activators which can be used in this invention are salts of Ib elements in the periodic table such as Cu and Ag. These salts are preferably water soluble in order to be uniformly mixed with the host material.

Preferred salts for the activator are $CuCl_2$, $CuSO_4$, $Cu(NO_3)_2$ and $AgNo_3$ which are used in a conventional method. The amount of the activator can be a conventionally used amount in conventional methods, and is preferably in the range from 0.005 to 0.1 part, more preferably from 0.01 to 0.04 part, by weight on the basis of 100 parts by weight of the host material. If the amount of the activator is too large or too small, then the effect of the activator addition, i.e. to increase the photosensitivity, does not appear.

Preferred fluxes which can be used in this invention are chlorides or bromides of Cd or Zn ($CdCl_2$, $CdBr_2$, $ZnCl_2$ and $ZnBr_2$) which are used in a conventional method. Each of these chlorides and bromides can be added alone or together. The flux, when heated at a temperature higher than the melting point thereof, becomes fused and dissolves the host material therein. When cooled, the host material becomes recrystallized. The flux also functions to diffuse or dope the activator in the recrystallization of the hot material. The amount of the flux is preferably betweeen 0.1 to 1 part by weight on the basis of 100 parts by weight of the host material. If the amount is too small, the effect of the flux addition does not appear, and if the amount is too large, then a washing step to remove a remaining flux in the fired and cooled material becomes necessary. In a conventional method, a large amount of flux such as 10 parts by weight on the basis of 100 parts by weight of a host material such as CdSe is used, and the washing step is used. It is one of the findings of this invention that the washing step is not preferred because it causes the photosensitivity to decrease.

Further, known antioxidants such as $NH_4Cl$ and $NH_4Br$ (for suppressing oxidization of CdSe and ZnS) can be used in this invention in a small amount such as 0.1 to 5 parts by weight on the basis of 100 parts by weight of the host material. Either $NH_4Cl$ and $NH_4Br$ can be added alone or together.

Besides, halogens such as Cl, Br and I in these activator and flux material etc. work as co-activators to increase the photosensitivity by being diffused in the host material.

To subject these materials to a first firing step, they are preferably mixed with a small amount of water. The thus obtained mixture is preferably dried and is then subjected to the first firing step. The purpose of this firing step is to fuse the flux and dissolve the host material therein which gets recrystallized when cooled, and to diffuse or dope the activator in the recrystallized material. It is easy to select the firing conditions after appreciating this purpose. The firing temperature is required to be higher than the melting point of the flux. Preferred firing temperatures are between 500° and 700° C, more preferably between 580° and 620° C. Preferred firing times are between 15 minutes and 2 hours, although this is not limitative. If the firing (temperature, time) is insufficient, then the above -mentioned objective cannot be achieved. If the firing is excessive, then particle size growth occurs, which is not preferred for obtaining a resultant fine particle size. Known atmospheres for firing can be used for the first firing step, such as $N_2$ and $N_2$ containing a small amount of $O_2$, etc.

By cooling the thus fired mixture, the host material becomes crystallized at least partially to a solid solution; the thus treated material having the activator diffused therein. The thus cooled material is not in a body form, and possible small agglomerates can be easily separated into particles by slight stimulation.

The thus cooled product is then subjected to a re-firing step in a sulfur containing atmosphere. The purpose of this re-firing is to increase the threshold voltage of the material. Without this re-firing step, there may be an excess amount of halogens, as co-activators, remaining in the material which acts to decrease the threshold voltage of the material. But by the re-firing, such excess amount of halogens can be removed. The amount of sulfur and the re-firing temperature and time are selected for this purpose. The amount of sulfur cannot be set forht numerically, because it depends on the volume of the chamber for the re-firing, and the amount of excess of the halogens. Moreover, to remove excess halogens by re-firing in a sulfur containing atmosphere is per se known. Thus, no detailed explanation thereof is deemed necessary. Preferred re-firing temperature are 440° C to 550° C, and preferable re-firing times are 15 minutes to 2 hours, although these are not limitative. Excessive re-firing decreases the photosensitivity of the resultant material. The atmosphere for the re-firing other than the sulfur vapor can be the same as that usable for the first firing. The atmosphere can be changed to vacuum at a latter period of the re-firing.

Before subjecting the material to the re-firing step, a second firing can be carried out, if desired, by adding to the cooled material (after being first fired), a flux and an antioxidant and water, mixing, drying and firing it under a condition similar to that for the first firing. The purpose of this second firing is to increase the photosensitivity of the material.

As set forth above, according to this invention, it is believed that ZnS and Mn salts diffused to the surface layer of CdSe particles act to raise the threshold voltage Vt, ZnO acts to decrease contact resitance among the photoconductive particles, and ZnS and ZnO act to suppress growth of photoconductive particles during the firing step and give fine particles.

The following Examples 1 to 5 are set forth for the purpose of illustration only, and should not be construed to limit the scope of this invention.

EXAMPLE 1

A preferred method for preparing the photoconductive powder according to this invention is as follows. 9 g of CdSe powder (purity of 99.999%; average particle size of about 2 microns), 0.5 g of ZnS (purity of 99.999%; average particle size of about 0.2 micron), 0.5 g of ZnO (purity of 99.999%; average particle size of about 0.2) micron, 0.002 g of $CuCl_2$ (activator), 0.05 g of $CdCl_2$ (flux), 0.1 g of $NH_4Cl$ (antioxidant) and 3.5 g of $H_2O$ were mixed together in a 50 ml beaker. This was the starting mixture and was dried at about 150° C for about 2 hours. This dried mixture was then placed in a quartz boat and fired at 500° C for 30 minutes in an atmosphere of $N_2$ containing 0.2% by volume of $O_2$. This fired product was a slightly sintered material, but when it was manually pressed by using a spoon, it was easily broken into fine powder particles which passed through a 400 mesh sieve which is the finest sieve available at present. 400 mesh means particles of less than about 37 microns can pass therethrough. At this stage, dark resistivity of the powder was low. By the first firing, the host material was recrystallized at least partially to a solid solution, and activators and co-activators were diffused into the resultant product. As the amount of flux used here was far smaller than that used in a conventional method, almost all of the excessive flux was removed by volatilization during the first firing. Since the washing step which is necessarily used in the prior art to remove th excessive flux was omitted here, decreasing the photosensitivity of the fired produce caused by the washing could be avoided. The product, i.e. powder, thus obtained was screened by a 400 mesh sieve and was then mixed with 0.1 g of sulfur powder, and re-fired at 470° C for 30 minutes in $N_2$. This re-fired product was passed through a 400 mesh sieve. At this stage, the sieved powder exhibited a high dark resistivity and extremely high photosensitivity.

The properties of photoconductive powders were tested by the method described below. 5 g of the resultant photoconductive powder was mixed with 0.4 g of a thermosetting epoxy resin (Araldite AZ-102 manufactured by Chiba Co. Ltd, Basel, Switzerland) containing 7.5 PHR of a hardener (No. 951 produced by Chiba Co., Ltd.) and 1.25 cc of diacetone alcohol. By vacuum depositing A1 on a glass plate, a glass plate having four pairs of electrodes was prepared, each pair of electrodes being spaced by 0.5 mm from each other and the four pairs being electrically connected in parallel, each of the eight electrodes having a length of 5 mm. Four drops of the mixture were put on the glass to fill the four spaces defined by the four pairs of the spaced A1 electrodes, respectively, and were allowed to dry and were cured at 120° C for 30 minutes and were then brought to room temperature. The thus made sample was a specimen to be subjected to measurements.

The photo-current $I_p$ which represents the photosensitivity, was measured by applying 360 volts of a.c. (lkHz) voltage and 10 luxes of light from a tungsten lamp (color temperature of 2850° K) to the specimen. Dark current $I_d$ vs. applied voltage characteristics were also measured by applying a.c. (lkHz) voltage to the specimen. The threshold voltage Vt was determined as the voltage where a transition from linear to superlinear (non-linear) $I_d$-V characteristics occurred. The average particle size *d* of photoconductive powders was determined by a microphotographic method. The same treatments and test were performed with other compositions of host materials. The total amount of host material (10 g) and other conditions of preparation were maintained in each treatment. The compositions of host materials and the results of tests are shown in Table 1.

It is evident from Table 1 that (1) the specimens containing photoconductive powder comprising ZnO and CdSe have markedly large photo-currents $I_p$ (i.e. photosensitivity) and very low threshold voltages Vt, (2) the specimens containing photoconductive powder comprising ZnS and CdSe have relatively small $I_p$ and markedly high Vt, (3) the specimens containing photoconductive powder comprising suitable compositions of ZnS, ZnO and CdSe have large $I_p$ and high Vt and (4) the higher the proportion of ZnS and ZnO, the smaller the average particle size *d* of photoconductive powders. It is to be noted that a markedly large $I_p$, a high Vt and a small average particle size could be obtained easily by a photoconductive powder comprising ZnS, ZnO and CdSe.

EXAMPLE 2

Photoconductive powders were prepared and tested by the same method as that described in EXAMPLE 1 except that 0.002 g of $MnCl_2$ was added to the starting mixture. The compositions of host material and the results of tests are shown in Table 2.

EXAMPLE 3

The same mixtures described in EXAMPLE 2 were fired at 600° C for 30 minutes in an atmosphere of $N_2$ containing 0.2% by volume of $O_2$. Each of these fired products was cooled and mixed together with 0.03 g of $CdCl_2$, 0.1 g of $NH_4Cl$ and 4 g of $H_2O$, dried at 150° C for about 2 hours, passed through a 400 mesh sieve, fixed again under the conditions of the first firing, passed through a 400 mesh sieve again, mixed with 0.1 g of sulfur powder, fired again at 470° C for 30 minutes in $N_2$, passed through a 400 mesh sieve and tested by the same method described in EXAMPLE 1. The compositions of the host materials and the results of tests are shown in Table 3.

In the results of Tables 2 and 3, the relation between "the compositions of host material and the characteristics of resultant photoconductive powders and specimens" are similar to those of Table 1. However, comparison of Table 2 with Table 1 makes it clear that when the compositions of host material are the same, higher threshold voltage Vt and similar photo-current $I_p$ can be obtained in Table 2. It is clear that adding a suitable amount of Mn to the starting mixture is effective to raise Vt without decreasing $I_p$ of the resultant photoconductive powder. Comparing the characteristics of photoconductive powders and resultant specimens shown in Table 2 and those shown in Table 3, the former excels in fineness of average particle size, and the latter excels in photosensitivity.

Considering all of the photo-currents $I_p$, threshold voltage Vt and average particles size *d* shown in Tables 1, 2 and 3, it is evident that preferred compositions of host material are 3 to 15% by weight of ZnS, 2 to 20% by weight of ZnO and 65 to 95% by weight of CdSe.

EXAMPLE 4

Photoconductive powders were prepared and tested by the same method as that described in EXAMPLE 1 except that the compositions of host material here were 8.5 g of CdSe, 0.5 g of ZnS and 1.0 g of ZnO, and several different amounts of $MnCl_2$, as shown in Table 4, were added to the starting mixture. The amounts of $MnCl_2$ added and results of tests are shown in Table 4.

It is clear from Table 4 that the threshold voltage Vt increases along with the increasing of the amount of $MnCl_2$ added to the starting mixture. When the amount of $MnCl_2$ is small, photo-current $I_p$ is affected little. The average particle size of a photoconductive powder is affected little by adding of $MnCl_2$.

Considering $I_p$ and Vt shown in Table 4, the preferred amount of $MnCl_2$ is less than 0.5 parts by weight on the basis of 100 parts by weight of host material, and more preferably is in the range of 0.005 to 0.5 parts by weight on the same basis. In this range, $I_p$ is affected little, and Vt is markedly increased.

EXAMPLE 5

Photoconductive powders were prepared and tested by the same method as described in EXAMPLE 1 except that compositions of host material and added amount of $MnCl_2$ were changed here as shown in Table 5.

It is evident from Table 5 that Vt is raised by ZnS, and is raised moreover by co-existence of ZnS and Mn.

According to this invention, the conditions of preparation are not limited by those used in the EXAMPLES, as set forth beforehand.

As apparent from the above disclosure and EXAMPLES, an improved photoconductive powder characterized by high photosensitivity, markedly high threshold voltage and fineness can be prepared by the method of this invention which uses a suitable composition of host material comprising CdSe, ZnS and ZnO, suitable activators, fluxes and additives, especially Mn and other conditions of preparation.

It is another advantage of this invention that the photoconductive powder prepared by the method of this invention is superior in response to a photoconductive CdS powder. In a solid-state image converting panel wherein a photoconductive powder of this invention is used as a main constituent, a sufficiently high voltage can be applied to the panel without a large output radiation at the part where no input radiation (photo-ray) image exists. This makes the output image from the panel highly photosensitive, bright and contrasting. The picture quality and the resolution of the panel are also improved by the fineness of the photoconductive powder prepared by the method of this invention. It is clear that the photoconductive powder prepared by the method of this invention can be equally applied to similar solid-state image panels such as a solid-state image intensifying panel, a solid-state image converting intensifying panel, etc. thus obtaining excellent characteristics.

Table 1

| Compositions of host material (wt, %) | | | Characteristics of resultant photoconductive powders and specimens | | |
|---|---|---|---|---|---|
| ZnS | ZnO | CdSe | Photocurrent Ip (μA) | Threshold Voltage Vt (V) | average particle size d (μ) |
| 0 | 0 | 100 | 520 | 400 | 8.8 |
| 0 | 5 | 95 | 3,000 | 250 | 7.3 |
| 0 | 10 | 90 | 6,400 | 75 | 6.9 |
| 0 | 15 | 85 | 8,500 | 50 | 6.3 |
| 5 | 0 | 95 | 280 | 600 | 7.5 |
| 5 | 2 | 93 | 770 | 550 | 7.0 |
| 5 | 5 | 90 | 1,060 | 550 | 6.6 |
| 5 | 10 | 85 | 980 | 500 | 6.3 |
| 5 | 15 | 80 | 590 | 500 | 5.4 |
| 5 | 20 | 75 | 450 | 450 | 4.2 |
| 5 | 25 | 70 | 300 | 400 | 3.8 |
| 10 | 0 | 90 | 190 | 800< | 7.0 |
| 10 | 2 | 88 | 380 | 800< | 7.1 |
| 10 | 5 | 85 | 530 | 800< | 6.7 |
| 10 | 10 | 80 | 470 | 750 | 5.9 |
| 10 | 15 | 75 | 260 | 700 | 5.0 |
| 10 | 20 | 70 | 95 | 700 | 4.2 |
| 10 | 25 | 65 | 62 | 650 | 3.7 |
| 13 | 0 | 87 | 70 | 800< | 6.8 |
| 13 | 5 | 82 | 390 | 800< | 6.6 |
| 13 | 10 | 77 | 210 | 800< | 5.5 |
| 13 | 15 | 72 | 80 | 800< | 4.8 |
| 13 | 20 | 67 | 20 | 800< | 4.1 |
| 15 | 0 | 87 | 10 | 800< | 6.1 |
| 15 | 5 | 80 | 15 | 800< | 5.7 |
| 15 | 10 | 75 | 10 | 800< | 5.1 |
| 15 | 15 | 70 | 10 | 800< | 4.6 |

Table 2

| Compositions of host materials (wt. %) | | | Characteristics of resultant photoconductive powders and specimens | | |
|---|---|---|---|---|---|
| ZnS | ZnO | CdSe | Ip (μA) | Vt (V) | d (μ) |
| 0 | 0 | 100 | 560 | 400 | 9.1 |
| 0 | 5 | 95 | 2,700 | 275 | 7.4 |
| 0 | 10 | 90 | 5,100 | 100 | 7.1 |
| 3 | 0 | 97 | 360 | 550 | 8.2 |
| 3 | 2 | 95 | 1,050 | 525 | 7.8 |
| 3 | 5 | 92 | 2,480 | 475 | 7.4 |
| 3 | 10 | 87 | 2,000 | 425 | 6.5 |
| 3 | 20 | 77 | 960 | 375 | 5.8 |
| 5 | 0 | 95 | 230 | 700 | 7.3 |
| 5 | 2 | 93 | 950 | 650 | 7.4 |
| 5 | 5 | 90 | 1,010 | 600 | 6.8 |
| 5 | 10 | 85 | 900 | 575 | 6.1 |
| 5 | 20 | 75 | 490 | 550 | 4.6 |
| 5 | 25 | 70 | 400 | 450 | 3.9 |
| 10 | 0 | 90 | 80 | 800< | 7.3 |
| 10 | 5 | 85 | 490 | 800< | 6.6 |
| 10 | 10 | 80 | 460 | 800< | 6.1 |
| 10 | 20 | 70 | 190 | 750 | 4.5 |
| 10 | 25 | 65 | 156 | 725 | 3.5 |
| 13 | 0 | 87 | 50 | 800< | 6.5 |
| 13 | 5 | 82 | 190 | 800< | 6.5 |
| 13 | 10 | 77 | 150 | 800< | 5.7 |
| 13 | 15 | 72 | 80 | 800< | 4.7 |
| 15 | 0 | 85 | 5 | 800< | 6.3 |
| 15 | 10 | 75 | 15 | 800< | 5.2 |

Table 3

| Compositions of host materials (wt. %) | | | Characteristics of resultant photoconductive powders and specimens | | |
|---|---|---|---|---|---|
| ZnS | ZnO | CdSe | Ip ($\mu$A) | Vt (V) | d ($\mu$) |
| 0 | 0 | 100 | 760 | 400 | 12.1 |
| 5 | 0 | 95 | 470 | 650 | 9.2 |
| 5 | 2 | 93 | 1,300 | 600 | 9.3 |
| 5 | 5 | 90 | 2,350 | 575 | 8.8 |
| 5 | 10 | 85 | 2,010 | 525 | 8.7 |
| 5 | 20 | 75 | 1,180 | 500 | 6.7 |
| 10 | 0 | 90 | 300 | 800< | 9.3 |
| 10 | 2 | 88 | 570 | 800< | 9.0 |
| 10 | 5 | 85 | 860 | 750 | 8.7 |
| 10 | 10 | 80 | 800 | 675 | 8.5 |
| 10 | 20 | 70 | 510 | 625 | 6.9 |
| 10 | 25 | 65 | 420 | 600 | 5.5 |
| 15 | 0 | 85 | 90 | 800< | 8.6 |
| 15 | 5 | 80 | 250 | 800< | 8.2 |
| 15 | 10 | 75 | 350 | 800< | 6.7 |
| 15 | 20 | 65 | 180 | 800< | 5.0 |
| 15 | 25 | 60 | 130 | 800< | 4.1 |
| 20 | 0 | 80 | 10 | 800< | 5.7 |
| 20 | 10 | 70 | 25 | 800< | 5.1 |
| 20 | 20 | 60 | 15 | 800< | 3.4 |

Table 4

| $MnCl_2$ added | | Characteristics of resultant photoconductive powders and specimens | | |
|---|---|---|---|---|
| (mg) | (wt %) | Ip ($\mu$A) | Vt (V) | d ($\mu$) |
| 0.0 | 0.000 | 1,030 | 400 | 6.0 |
| 0.1 | 0.001 | 990 | 400 | 6.1 |
| 0.5 | 0.005 | 1,000 | 500 | 5.8 |
| 1 | 0.01 | 900 | 550 | 6.3 |
| 5 | 0.05 | 920 | 600 | 6.2 |
| 10 | 0.1 | 870 | 700 | 6.5 |
| 50 | 0.5 | 710 | 750 | 6.7 |
| 100 | 1.0 | 480 | 800< | 7.2 |

Table 5

| Compositions of host materials (wt. %) | | | $MnCl_2$ added | Characteristics of resultant photoconductive powders and specimens | | |
|---|---|---|---|---|---|---|
| ZnS | ZnO | CdSe | (wt. %) | Ip ($\mu$A) | Vt (V) | d ($\mu$) |
| 0 | 0 | 100 | 0.00 | 590 | 400 | 8.8 |
| 0 | 0 | 100 | 0.02 | 560 | 400 | 9.1 |
| 0 | 5 | 95 | 0.00 | 3,000 | 250 | 7.2 |
| 0 | 5 | 95 | 0.02 | 2,700 | 275 | 7.4 |
| 5 | 0 | 95 | 0.00 | 280 | 600 | 7.5 |
| 5 | 0 | 95 | 0.02 | 230 | 700 | 7.3 |
| 5 | 5 | 90 | 0.00 | 1,220 | 525 | 6.6 |
| 5 | 5 | 90 | 0.02 | 1,010 | 600 | 6.8 |

What is claimed is:

1. A method for preparing a photoconductive powder comprising: providing a starting mixture comprising (i) a host material consisting essentially of 65 to 95% by weight of CdSe powder, 3 to 15% by weight of ZnS powder and 2 to 20% by weight of ZnO powder, (ii) as an activator, 0.005 to 0.1 parts by weight, on the basis of 100 parts by weight of said host material, of a water soluble salt of one member selected from the group consisting of Cu and Ag and (iii) as a flux, 0.1 to 1 part by weight, on the basis of 100 parts by weight of said host material, of one member selected from the group consisting of $CdCl_2$, $CdBr_2$, $ZnCl_2$ and $ZnBr_2$; firing said starting mixture at a temperature higher than the melting point of said flux to fuse said flux and dissolve said host material in said flux; cooling the thus fired mixture to recrystallize said host material at least partially to a solid solution, the thus treated material having said activator diffused therein; and re-firing the thus treated material in a sulfur containing atmosphere to increase the threshold voltage of the material.

2. A method for preparing a photoconductive powder according to claim 1, wherein the first firing step is performed at a temperature between 500 and 700° C for 15 minutes to 2 hours.

3. A method for preparing a photoconductive powder according to claim 1, wherein said re-firing step is performed at a temperature between 440° and 500° C for 15 minutes to 2 hours.

4. A method for preparing a photoconductive powder according to claim 1, wherein said CdSe powder has an average particle size less than 5 microns, and said ZnS and ZnO powders have an average particle size less than 1 micron.

5. A method for preparing a photoconductive powder according to claim 1, wherein said activator is one member selected from the group consisting of $CuCl_2$, $CuSO_4$, $Cu(NO_3)_2$ and $AgNO_3$.

6. A method for preparing a photoconductive powder according to claim 1, wherein said starting mixture further comprises 0.1 to 5 parts by weight, on the basis of 100 parts of said host material of one member selected from the group consisting of $NH_4Cl$ and $NH_4Br$.

7. A method for preparing a photoconductive powder according to claim 1, wherein said starting mixture further includes 0.005 to 0.5 parts by weight, on the basis of 100 parts by weight of said host material, of a water soluble Mn salt to increase the threshold voltage of the resultant material.

8. A method for preparing a photoconductive powder according to claim 9, wherein said water soluble Mn salt is one member selected from the group consisting of $MnCl_2$, $Mn(NO_3)_2$ and $MnSO_4$.

9. A method for preparing a photoconductive powder according to claim 8, wherein said Mn salt is $MnCl_2$.

10. A method for preparing a photoconductive powder according to claim 1, which further comprises performing between said cooling and re-firing steps, the step of: adding to the cooled material as a flux, one member selected from the group consisting of $CdCl_2$, $CdBr_2$, $ZnCl_2$ and $ZnBr_2$; and again firing the thus treated material under the conditions of the first firing.

11. A method according to claim 1, wherein said firing is performed at between 580° and 620° C.

12. A method according to claim 5 wherein the amount of said activator is 0.01 to 0.04 parts by weight on the basis of 100 parts by weight of said host material.

* * * * *